United States Patent [19]

Nakano

[11] Patent Number: 4,862,415

[45] Date of Patent: Aug. 29, 1989

[54] COMPLEMENTARY SEMICONDUCTOR DEVICE REDUCING LATCH-UP PHENOMENON

[75] Inventor: Tomio Nakano, Kawasaki, Japan

[73] Assignee: Fujitsu Limited, Kawasaki, Japan

[21] Appl. No.: 266,332

[22] Filed: Nov. 1, 1988

Related U.S. Application Data

[63] Continuation of Ser. No. 896,190, Aug. 14, 1986, abandoned.

[30] Foreign Application Priority Data

Aug. 14, 1985 [JP] Japan ............................. 60-178958

[51] Int. Cl.$^4$ .................. G11C 7/00; G11C 11/40
[52] U.S. Cl. ......................... 365/189.09; 365/226; 365/190; 307/296.1
[58] Field of Search ............... 365/189, 181, 190, 226; 307/296 R, 297, 594, 597

[56] References Cited

U.S. PATENT DOCUMENTS

| | | | |
|---|---|---|---|
| 4,337,524 | 6/1982 | Parkinson | 365/189 X |
| 4,631,421 | 12/1986 | Inoue et al. | 307/594 X |
| 4,638,464 | 1/1987 | Cranford, Jr. et al. | 365/226 |
| 4,678,941 | 7/1987 | Chao et al. | 365/230 X |

OTHER PUBLICATIONS

ISSCC 84/Friday, Feb. 24, 1984/Continental Ballrooms 8-9/10:45 AM "A Sub 100 ns 255K Dram in CMOS III Technology", Roger Kune et al.

*Primary Examiner*—Stuart N. Hecker
*Assistant Examiner*—Alyssa H. Bowler
*Attorney, Agent, or Firm*—Staas & Halsey

[57] ABSTRACT

A semiconductor device has a substrate of a first conductivity type including a well of a second conductivity type opposite to the first conductivity type. The semiconductor device comprises a bias potential generating circuit for generating a potential in the substrate or the well; a potential detecting circuit for detecting a potential of the substrate or the well and a gate circuit. The gate circuit is connected to the potential detecting circuit and to an internal circuit and applies an enable signal to the internal circuit in accordance with the detected potential of the substrate or the well. Consequently, latch-up of parasitic transistors in a CMIS-inverter circuit of the semiconductor device can be prevented.

24 Claims, 6 Drawing Sheets

COMPLEMENTARY SEMICONDUCTOR DEVICE REDUCING LATCH-UP PHENOMENON

This is a continuation of co-pending application Ser. No. 896,190 filed on Aug. 14, 1986, now abandoned.

BACKGROUND OF THE INVENTION

1. Field of the Invention

The present invention relates to a semiconductor device using complementary metal-oxide semiconductor (CMOS) circuits, or more broadly, complementary metal-insulator semiconductor (CMIS) circuits, and, in particular, to a complementary semiconductor device for reducing a latch-up phenomenon, e.g., the latch-up phenomenon rise on parasitic thyristor based on a PNPN configuration, in CMOS devices.

2. Description of the Related Art

In general, a cell of DRAM having a capacitor and a MOS transistor uses an N-type MOS transistor for improving the operation speed and for miniaturizing the DRAM device. However, the N-type MOS transistor, especially in a microminiaturized cell for large scale integration of the DRAM device, has a serious problem in that the N-type transistor causes soft errors when α-rays impinge thereon. The soft errors caused by the impingement of the α-rays is that a content of the memory cell is destroyed. Note, α-rays are produced from uranium (U) or thorium (Th) in package or semiconductor materials.

Recently, for reducing soft errors in an N-type MOS transistor caused by α-rays, a cell of a DRAM having a capacitor and MOS transistor comprises a P-type MOS transistor instead of an N-type MOS transistor. It is preferable that an N-type MOS transistor is used as a word line driver transistor of the memory cell for obtaining a high speed operation, even if a P-type MOS transistor is used as an access transistor of a memory cell.

When using a P-type MOS transistor as the access transistor and an N-type MOS transistor as the word line driver transistor, if a specific word line is at a high level, e.g., a high power source potential of 5 V, a cell connected to the specific word line is not selected. On the other hand, when the specific word line is at a low level, e.g., a negative potential corresponding to a threshold voltage of the access transistor, the cell connected to the specific word line is selected without a voltage drop by the threshold voltage of the access transistor. That is in a DRAM device using a P-type MOS transistor as the access transistor and an N-type MOS transistor as the word line driver transistor, a substrate including a CMOS-circuit should be supplied with a negative bias potential in order to keep a P-N junction at a reverse bias state against the negative potential for selecting the specific word line.

SUMMARY OF THE INVENTION

It is an object of the present invention to provide a complementary semiconductor device which can be prevented from a latch-up phenomenon in CMOS devices.

According to the present invention, a semiconductor device having a substrate of a first conductivity type including a well of a second conductivity type opposite to the first conductivity type comprises a bias potential generating circuit for generating a potential in the substrate or the well, a potential detecting circuit for detecting a potential of the substrate or the well, and a gate circuit. The gate circuit is connected to the potential detecting circuit and to an internal circuit and applies an enable signal to the internal circuit in accordance with the detected potential of the substrate or the well.

BRIEF DESCRIPTION OF THE DRAWINGS

The present invention will be more clearly understood from the description as set forth below with reference to the accompanying drawings, wherein:

FIG. 8 is a graph illustrating the operation of the internal circuit shown in FIG. 7.

DESCRIPTION OF THE PREFERRED EMBODIMENTS

For a better understanding of the preferred embodiments, the problems in the related art will first be explained with reference to FIGS. 1, 2, 3, and 4.

Figure 1:
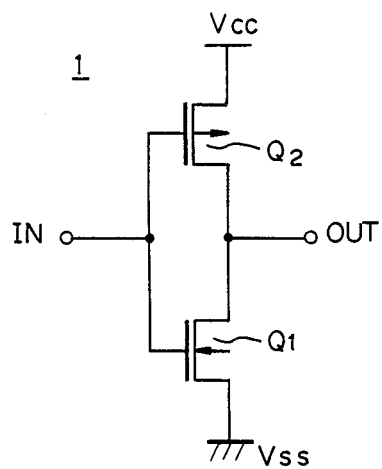
FIG. 1 is a circuit diagram of a general CMOS-inverter.

In FIG. 1, which shows a circuit diagram of a general CMOS-inverter 1, the general CMOS-inverter 1 consists of an N-channel type MOS transistor Q1 and a P-channel type MOS transistor Q2, and the transistor Q1 is series connected to the transistor Q2.

Figure 2:
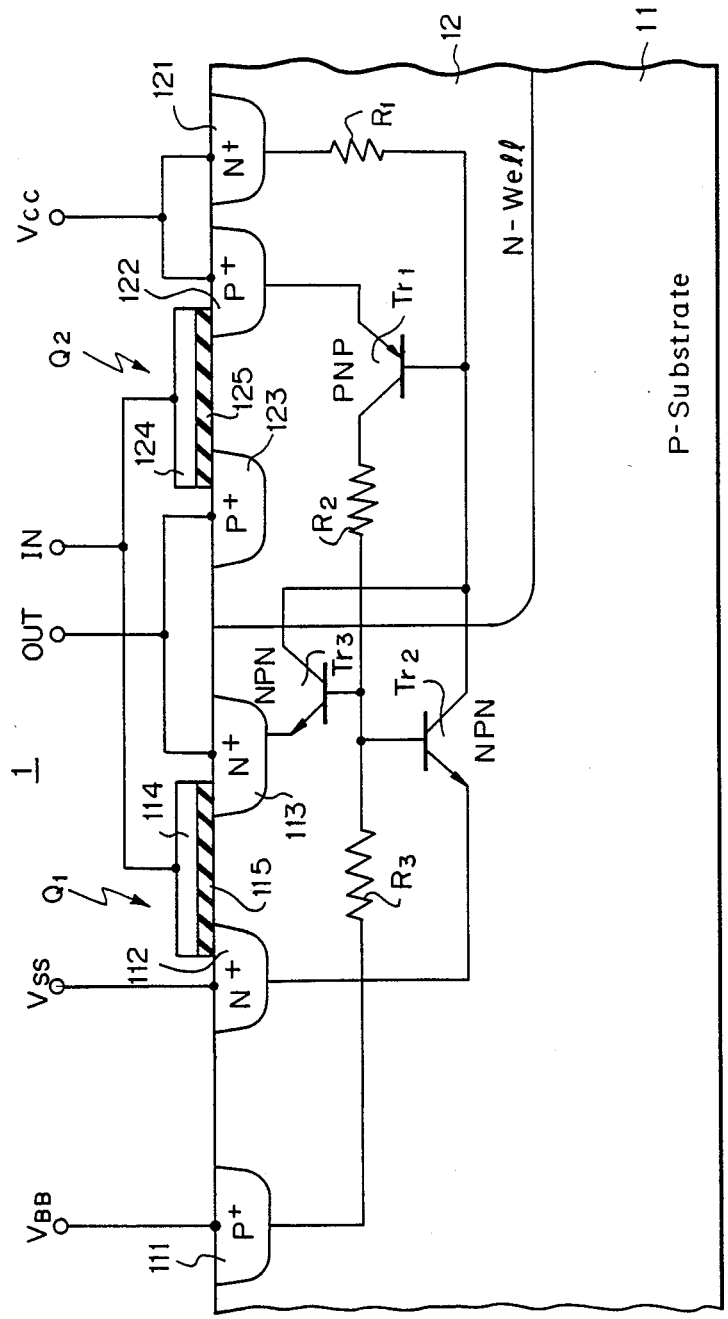
FIG. 2 is a cross-sectional view of the CMOS-inverter circuit for explaining a latch-up phenomenon of parasitic transistors shown in FIG. 1.

FIG. 2 is a cross-sectional view of the CMOS-inverter 1 for explaining a latch-up phenomenon of the parasitic transistors shown in FIG. 1. Referring to FIG. 2 showing a construction of the CMOS-inverter 1, the N-channel type MOS transistor Q1 is formed in a P-conductivity type substrate 11 and the P-channel type MOS transistor Q2 is formed in an N-conductivity type well 12 composed on the substrate 11. A source 112 and a drain 113 of the transistor Q1, which have N+-conductivity type impurity ranges, are formed in the subsurface of the substrate 11. A gate 114 of the transistor Q1 is formed on the upper part of the substrate 11 between the source 112 and the drain 113 through an oxide film 115, and a substrate contact portion 111 which has a P+-conductivity type impurity range, is also formed in the subsurface of the substrate 11. Similarly, a source 122 and a drain 123 of the transistor Q2, which have P+-conductivity type impurity regions, are formed in the subsurface of the well 12. A gate 124 of the transistor Q2 is formed on the upper part of the well 12 between the source 122 and the drain 123 through an oxide film 125, and a contact portion 121 for well contact to the well 12, which has an N+-conductivity type impurity range, is also formed in the subsurface of the well 12.

The gate 114 of the transistor Q1 and the gate 124 of the transistor Q2 are connected and are used as an input of the CMOS-inverter 1. The drain 113 of the transistor Q1 and the drain 123 of the transistor Q2 are connected and are used as an output of the CMOS-inverter 1. The source 112 of the transistor Q1 is supplied with an earth potential Vss, e.g., 0 V, and the contact portion 111 is generally supplied with a negative potential $V_{BB}$ by the substrate generating circuit (not shown). The source 122 of the transistor Q2 and the contact portion 121 formed in the well 12 are connected and are supplied with a high power source potential Vcc, e.g., 5 V.

The above CMOS-inverter 1 has parasitic transistors, i.e., parasitic transistors Tr1, Tr2 and Tr3, formed in the CMOS-inverter 1 as shown in FIG. 2. The parasitic transistor Tr1 is a PNP-type bipolar transistor, the emitter of which is the source 122 of the P-channel type MOS transistor Q2, the base is the contact portion 121 including an equivalent resistance R1, and the collector is the contact portion 111 including equivalent resistances R2 and R3. The parasitic transistor Tr2 is an NPN-type bipolar transistor, the emitter of which is the source 112 of the N-channel type MOS transistor Q1, the base is the contact portion 111 including the equivalent resistance R3, and the collector is the contact portion 121 including the equivalent resistance R1. The parasitic transistor Tr3 is an NPN-type bipolar transistor, the emitter of which is the drain 113 of the N-channel type MOS transistor Q1, the base is the substrate contact portion 111 including the equivalent resistance R3, and the collector is the contact portion 121 including the equivalent resistance R1.

Note, a semiconductor device using the above CMOS-inverter circuits especially a drain of an N-channel type MOS transistor pulled down to a negative potential, a P-conductivity type substrate where the N-channel type MOS transistor is formed should be supplied with a negative potential in order to keep an N+-P junction between the drain and the substrate in a reverse bias state by the substrate bias generating circuit. For example, this substrate bias generating circuit is a small capacity of DC-DC converter, and therefore, when the N+-P junction has deteriorated from aging or other factors, the negative bias potential of the substrate is not enough to avoid a latch-up phenomenon of the CMOS-inverter circuits.

When the negative potential of the P-conductivity type substrate is not sufficient, and the drain of the N-channel type MOS transistor is pulled down to the negative potential, then the latch-up phenomenon is caused in the CMOS-inverter circuits. This latch-up phenomenon in the CMOS-inverter will be now described.

Figure 3:
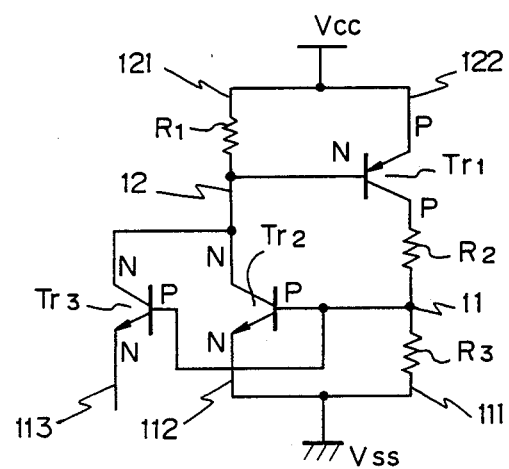
FIG. 3 is a equivalent circuit diagram of the CMOS-inverter shown in FIG. 2.

Referring to FIGS. 2 and 3, when the drain 113 of the N-channel type MOS transistor Q1, which has the N+-conductivity type impurity range, is pulled down to a negative potential, and the P-conductivity type substrate 11 is not supplied with a negative potential enough to keep a N+-P junction between the drain 113 and the substrate 11 in the reverse bias state, then the latch-up phenomenon is caused. That is to say, when the drain 113 is pulled down to the negative potential, electrons are injected in the substrate 11. Some of the electrons are recombinated with holes in the substrate 11, and the other electrons are injected in the N-conductivity type well 12. The flow of the electrons from the substrate 11 to the well 12 produces base currents at the parasitic transistors of NPN-type bipolar transistor Tr3. Therefore, the transistor Tr3 is switched ON, and collector currents of the transistor Tr3 flow through the equivalent resistor R1 to the contact portion 121. The voltage drop by the resistance R1 causes a current flow through the base of the parasitic PNP-type bipolar transistor Tr1 and, accordingly, the transistor Tr1 is switched ON. As a result of the switching ON of the transistor Tr1, a collector current of the transistor Tr1 flows through the resistances R2 and R3 to the contact portion 111. The voltage drops by the resistances R2 and R3 causes a base current flow through each parasitic transistor Tr2 and Tr3, and, accordingly, the transistors Tr2 and Tr3 are switched ON.

Therefore, the collector current of the PNP-type parasitic transistor Tr1 acts upon the flow of the base currents of the NPN-type parasitic transistors Tr2 and Tr3, and the collector currents of the transistors Tr2 and Tr3 act upon the flow of the base current of the transistor Tr1, so that both the transistor Tr1 and the transistors Tr2 and Tr3 are kept in an ON state without injecting the electrons from the drain 113 to the substrate 11.

This is a latch-up phenomenon of the semiconductor device using CMOS-inverter circuits. The latch-up phenomenon is naturally caused in a complementary semiconductor device using a negative potential signal when a negative potential of a substrate is higher than a predetermined potential for avoiding the latch-up phenomenon.

Furthermore, a latch-up phenomenon may occur in the parasitic thyristor based on a PNPN configuration in a CMOS-inverter, when a clock circuit for generating a negative potential is operated before the substrate potential $V_{BB}$ is stabilized. Because it takes a long time such as 100 to 200 $\mu$s to stabilize the substrate potential $V_{BB}$ by using a substrate bias generating circuit, after the substrate bias generating circuit is supplied with the power supply.

Figure 4:
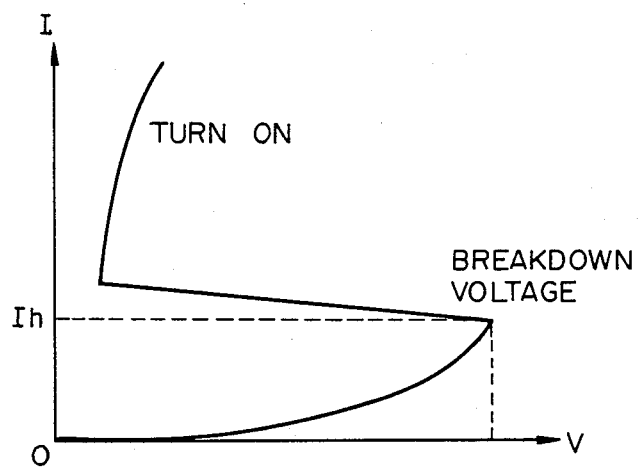
FIG. 4 is a graph illustrating the voltage-current characteristics of the parasitic thyristor shown in FIG. 3.

FIG. 4 is a graph illustrating the voltage-current characteristics of the parasitic thyristor shown in FIG. 3. The latch-up phenomenon of the CMOS-inverter 1 is sustained until a current of a turn-ON thyristor is decreased below a specific value Ih. If the current, which is flowing through the parasitic transistor in a latch-up state is not decreased below the specific value Ih, then the device would be destroyed by an excess power consumption.

Figure 5:
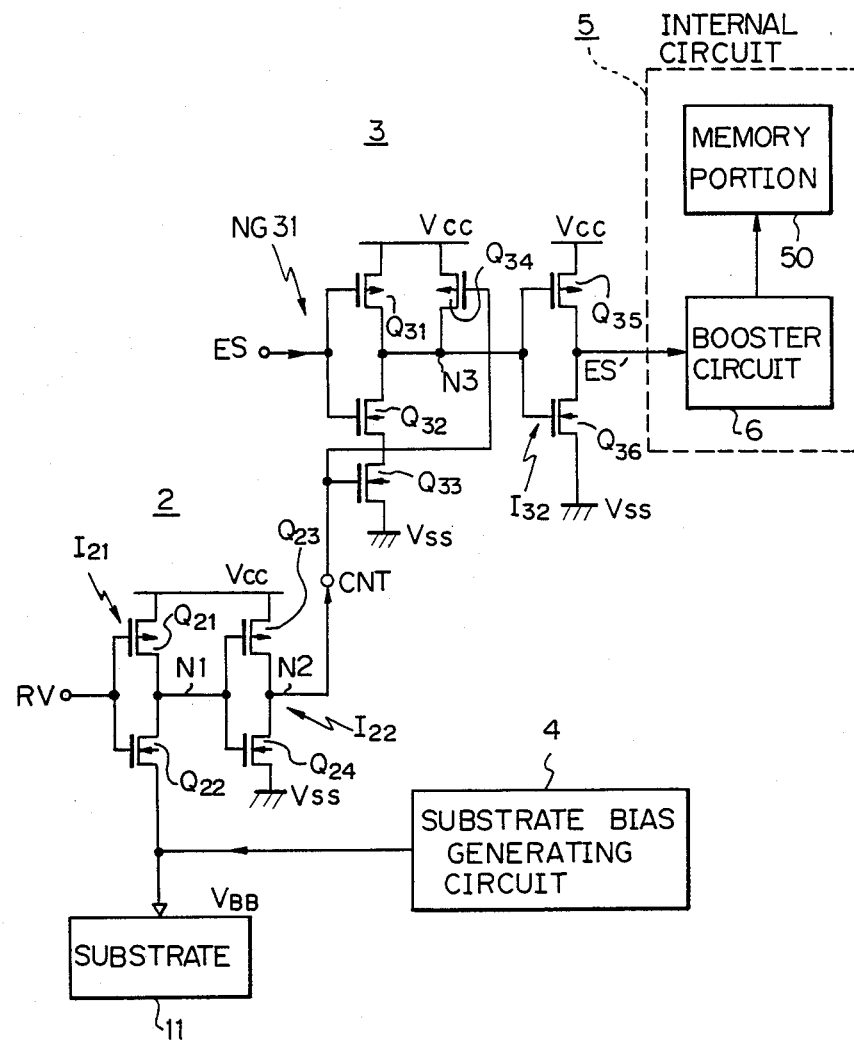
FIG. 5 is a block diagram illustrating a complementary semiconductor device according to the present invention.

A preferred embodiment of this present invention will now be explained with reference to FIGS. 5, 6, 7, 8, and 9. FIG. 5 is a block diagram illustrating a complementary semiconductor memory device according to the present invention.

As shown in FIG. 5, an output of a substrate bias generating circuit 4 is applied to a substrate 11 of a complementary semiconductor device and a substrate potential detecting circuit 2 is formed in the device. For example, the substrate 11 is a P-conductivity type and the output of the substrate bias generating circuit is a negative value. According to this negative potential of the output of the substrate bias generating circuit 4, the P-conductivity type substrate 11 is supplied with a negative potential enough to keep a N+-P junction formed in a CMOS-inverter in a reverse bias state.

Note, the above substrate bias generating circuit is, for example, a DC-DC converter, and this DC-DC converter has a small capacitance in order to save power. Therefore, when a N+-P junction formed in the substrate 11 is deteriorated by aging or other factors, the negative bias potential of the substrate, which is the output of the substrate bias generating circuit 4, is not enough to avoid a latch-up phenomenon of the CMOS-inverter circuits.

The substrate potential detecting circuit 2, which detects a negative potential of the substrate 11 and compares it with a predetermined value, is comprised of two CMOS-inverter circuits I21 and I22. The CMOS-inverter circuit I21 includes a P-channel type MOS transistor Q21 and an N-channel type MOS transistor Q22, the transistor Q21 has a source connected to a high potential power supply Vcc and the transistor Q22 has a source connected to the substrate 11. A gate of the transistor Q21 is connected to a gate of the transistor Q22 and a drain of the transistor Q21 is connected to a drain of the transistor Q22, respectively. Similarly, the CMOS-inverter circuit I22 includes a P-channel type MOS transistor Q23 and an N-channel type MOS transistor Q24. The transistor Q23 has a source connected to Vcc and the transistor Q24 has a source connected to Vss. A gate of the transistor Q23 is connected to a gate of the transistor Q24 and a drain of the transistor Q23 is connected to a drain of the transistor Q24, respectively. An output of the inverter circuit I21 is connected to an input of the inverter circuit I22 at a node N1.

A gate circuit 3 comprises a two-input CMOS NAND gate circuit NG31 formed by P-channel type MOS transistors Q31 and Q34, and N-channel type MOS transistors Q32 and Q33. The NAND gate circuit NG31 receives an enable signal ES and a control signal CNT. Also, the gate circuit 3 comprises a CMOS-inverter circuit I32 which is an output of the NAND gate circuit NG31. This CMOS-inverter circuit I32 includes a P-channel type MOS transistor Q35 and an N-channel type MOS transistor Q36, and generates an enable signal ES', and transmits it to a booster circuit 6 of an internal circuit 5.

Figure 6:
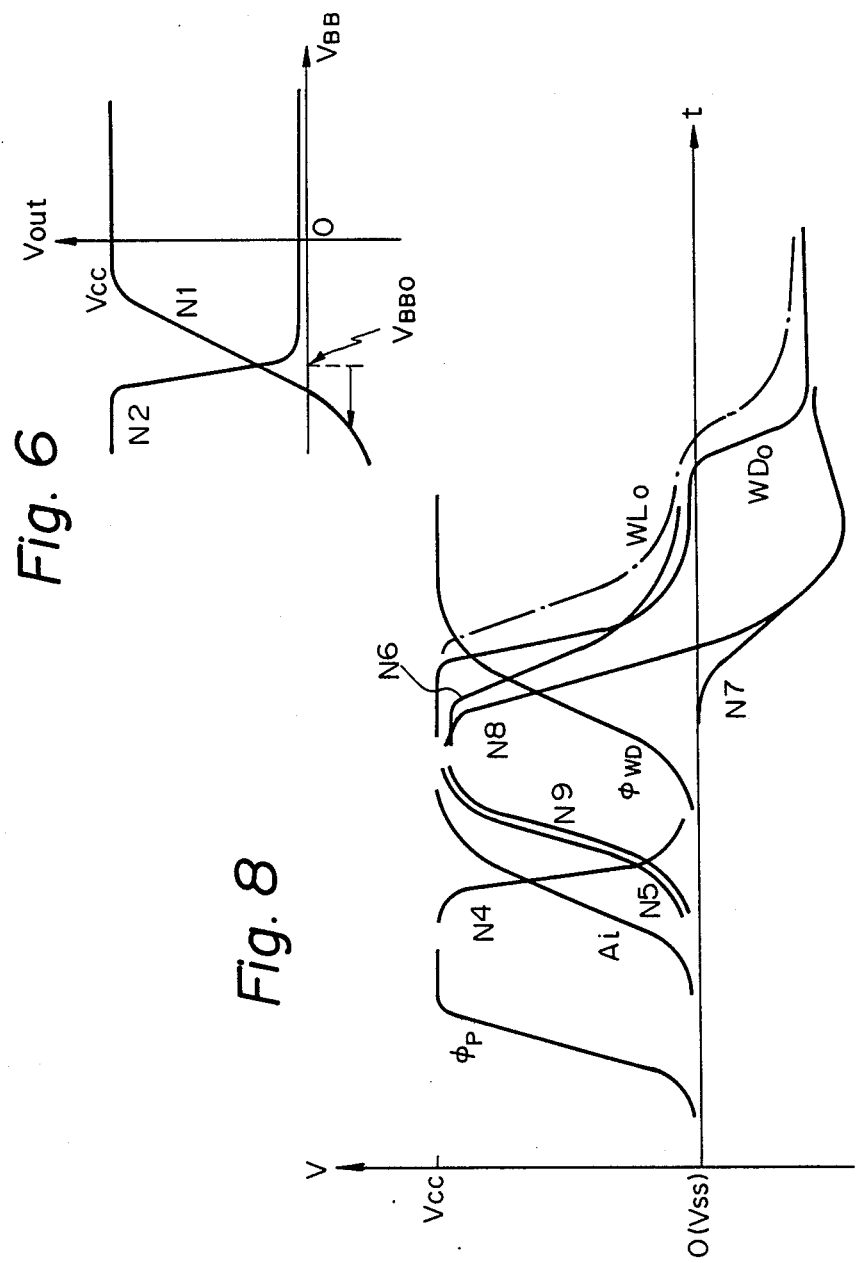
FIG. 6. is a graph illustrating the output characteristics of the substrate potential detecting circuit shown in FIG. 5.

The operation of the circuit of FIG. 5 will now be explained. In the substrate potential detecting circuit 2, an output of the CMOS-inverter circuit I21 is supplied with a reference voltage RV, and the source of the transistor Q22 is supplied with the potential of the substrate 11. The substrate potential detecting circuit 2 detects the potential of the substrate 11 and compares it with the reference voltage RV, and as a result of comparison, the circuit 2 produces the control signal CNT. Note that the reference voltage RV can be determined as a voluntary value, e.g., 0~5 V, in accordance with the operating potential or the specific value with the substrate potential and the conductance ratio of the transistors of the inverter I21. That is, as shown in FIG. 6, which shows the output characteristics of the circuit 2 shown in FIG. 5, when the substrate potential $V_{BB}$ is lower than a predetermined value such as −1 V as indicated by $V_{BB0}$, the node N1 is kept at a low level, and the node N2 (the control signal CNT), is at a high level. Thus, the enable signal ES is reversed by the NAND gate circuit NG31 and is further reversed by the inverter circuit I32. Consequently, the enable signal ES' becomes high. Therefore, the booster circuit 6 is activated and applies the boosted negative potential to the memory portion 50, thus the internal circuit 5 can be actuated.

Contrary to the above, as shown in FIG. 6, when the substrate potential $V_{BB}$ is not lower than the predetermined value $V_{BB0}$, the node N1 is at a high level, and the node N2 is at a low level. Thus, the enable signal ES' becomes low regardless of the level of the enable signal ES. Thus the internal circuit 5 is not activated, and the operation of the booster circuit 6, which generates the negative boosted potential, is stopped. Consequently, the latch-up phenomenon does not occur.

In the above mentioned embodiment, the output of the substrate bias generating circuit 4 is applied to the P-conductivity type substrate 11, and the substrate potential detecting circuit 2 detects the potential of the substrate 11. Where the substrate is an N-conductivity type, however, the output of the bias generating circuit can be applied to a P-conductivity type well formed in the N type substrate, the potential detecting circuit detects the potential of the P-type well. Moreover, the conductivity type of the substrate or the well is not limited to the P-conductivity type, that is, it can be an N-conductivity type. In this case, the substrate or the well is supplied with the positive potential of the bias generating circuit.

Figure 7:
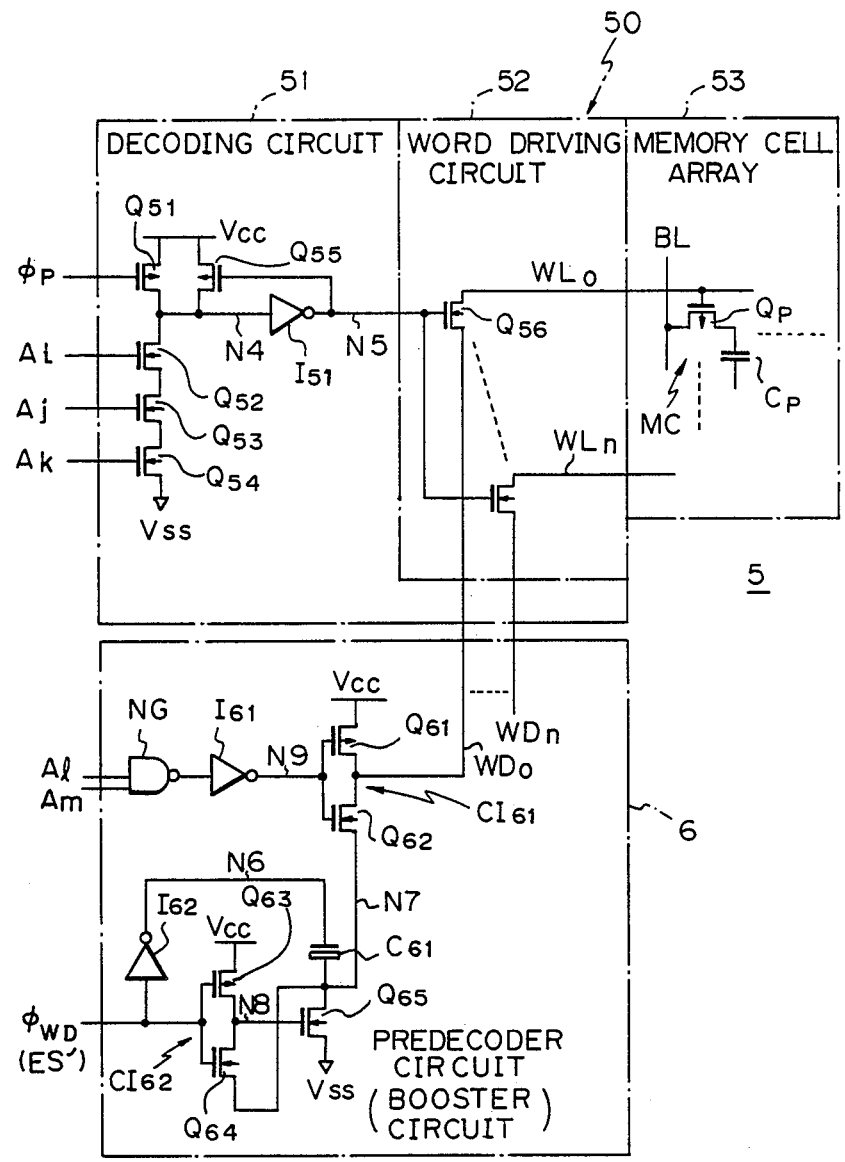
FIG. 7 is a circuit diagram of the internal circuit shown in FIG. 5.

FIG. 7 is a circuit diagram of the internal circuit shown in FIG. 5.

In FIG. 7, the internal circuit 5, which is a memory circuit, comprises a memory portion 50 and booster circuit 6. The memory portion 50 comprises a decoding circuit 51, a driving circuit 52, and memory cell array 53. In the decoding circuit 51, P-channel type MOS transistors Q51 and Q55 are connected in parallel between the high power source potential of the Vcc and a node N4, and N-channel type MOS transistors Q52, Q53, and Q54 are connected in series between the node N4 and the low power source potential of the Vss. A gate of the transistor Q51 receives a reset clock signal φp and gates of the transistors Q52, Q53, and Q54 receive address bits Ai, Aj, and Ak, respectively, which are a part of a plurality of bits forming an address signal. An inverter I51 is connected between the node N4 and a node N5 and its output is applied to a gate of the transistor Q55.

The driving circuit 52 comprises a plurality of N-channel type MOS transistors, which are provided in the same number as a plurality of word lines or a plurality of memory cells; one of which is representatively denoted by the reference symbol Q56. Gates of the N-channel type MOS transistors Q56 are connected to the node N5, drains of the transistors Q56 are connected to word lines from WLo to WLn, and sources of the transistors Q56 receive negative clock signals from WDo to WDn respectively. The clock signals from WDo to WDn are outputs of a predecoder circuit corresponding to the booster circuit 6 for applying a potential lower than the lower power source potential Vss to the driving circuit 52.

Reference numeral 53 denotes a memory cell array consisting of a plurality of dynamic memory cells, one of which is representatively denoted by a reference symbol MC. The memory cell MC is formed by a P-channel type MOS transistor Qp for a transfer gate and a capacitor Cp including the equivalent capacitance of the cell. The gate, source, and drain of the transistor Qp are connected to the word line WLo, the capacitor Cp, and a bit line BL for writing or reading data in memory cells MC, respectively.

In the booster circuit 6, reference symbol NG denotes a NAND gate circuit, to which the address bits Al and Am which are the rest of the address signal are sent. An output of the NAND gate circuit NG is connected to an input of an inverter I61 and an output of the inverter I61 is applied to an input of a CMOS-inverter circuit CI61. Reference symbol CI62 is another CMOS-inverter circuit consisting of Q63 and Q64. An input of CI62 is supplied with a clock $\phi$WD, which is the enable signal ES', for controlling the timing of a generation of the clock signal WDo to be generated based on an input of the predecoding address bits Al and Am. A source of the transistor Q64 is connected to a drain of Q65. A source of this transistor Q65 is connected to Vss and a gate of the transistor Q65 is connected to the output of CI62. An output of a inverter I62 is connected to an electrode of a capacitor C61 and another electrode of the capacitor C61 is connected to the drain of the transistor Q65. The drain of the transistor Q65 is also connected to a source of the transistor Q62.

FIG. 8 is a graph illustrating the waveforms of the operation of the internal circuit shown in FIG. 7. The operation of the device will be described below with reference to FIGS. 7 and 8.

First, the decoder reset clock $\phi$p is at a low level, i.e., 0 V and turns ON the transistor Q51, resulting in a charge-up state at the node N4. This charged-up state is maintained by the ON state of the transistor Q55, because its gate receives a low level potential of the output of the inverter I51.

Now, a general explanation of the memory portion 50 and a booster circuit 6 shown in FIGS. 7 and 8 will be described.

When the clock signal $\phi$p rises to a high level, i.e., 5 V and turns OFF the transistor Q51, then the address imputs Ai ~Aj are applied. If all of the address bits Ai, Aj and Ak are high, the potential at the node N4 falls to 0 V and the node N5 goes to a high level. When the level of the clock $\phi$WD at the node N8 begins to change from the high level to the low level, the potential at the node N6 also falls to the low level. At this time, the node N7 is lowered to negative potential by the coupling of the capacitor C61. Note that, when the clock $\phi$WD is fixed at the low level, that is, the enable signal ES' (FIG. 5) of the output of the gate circuit 3 is at the low level, the booster circuit 6 cannot generate a negative boosted potential, and the internal circuit 5 cannot be actuated. When address bits Al and Am are high, the potential at the node N9 rises to the high level, resulting in the ON state of the transistor Q62. Therefore, the potential of the clock signal WDo begins to fall from the high level Vcc to the negative potential, and then stays at the negative potential. This clock signal WDo of the negative potential is applied to the source of the word line driver MOS transistor Q56.

Since the potential at the node N5 is now at the high level, the word driver transistor Q56 turns ON, so that the potential at the word line WLo quickly falls according to the change in the clock signal WDo. Then, the potential at the word line WLo stays at the same negative potential in the selection state of the memory cell MC.

According to FIG. 7, transferring clock signal WD$_o$ to the word line WL$_o$ can be quickly made, because the N-channel type MOS transistor Q56 is employed as a word line driver.

In the above, the memory cell MC has a dynamic type random access memory (DRAM) configuration. A static type random access memory (SRAM) configuration can also be used.

Figure 9:
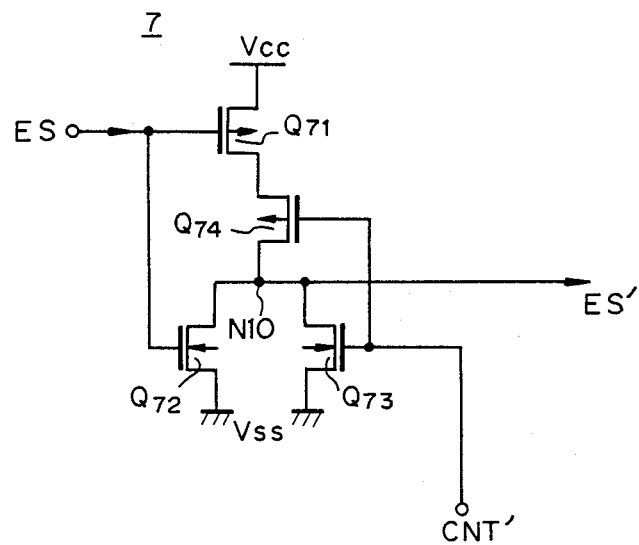
FIG. 9 is another example of the gate circuit shown in FIG. 7.

FIG. 9 is another example of a gate circuit shown in FIG. 7.

A gate circuit 7, which is a two-input CMOS NOR circuit, comprises P-channel transistors Q71 and Q74, and N-channel transistors Q72 and Q73. Gates of the transistor Q71 and the transistor Q72 are supplied with the enable signal ES, and gates of the transistor Q73 and the transistor Q74 are supplied with a control signal CNT', which is an output of a substrate potential detecting circuit. Now the control signal CNT' of the substrate potential detecting circuit is inverted from the control signal CNT of the substrate detecting circuit 2, and therefore, the control signal CNT' is high level, i.e. Vcc, when the substrate potential is higher than the predetermined value.

The operation of the above gate circuit 7 is similar to the gate circuit 2, but the operating polarity of the control signal CNT' is opposite to that of the control signal CNT of the substrate potential detecting circuit 2. When the substrate potential is higher than the predetermined value the control signal CNT' of the output of the substrate potential detecting circuit, which may be a CMOS-inverter circuit added to the substrate potential detecting circuit 2, changes to a high level. In the gate circuit 7, the transistor Q73 is switched ON and the transistor Q74 is switched OFF. Therefore, an enable signal ES does not appear at the output (ES'), so no activation clock ($\phi$WD) is applied to the booster circuit 6.

As explained hereinbefore, according to the present invention, the gate circuit is connected between the substrate or the well potential detecting circuit and to a booster circuit, and applies an enable signal to the booster circuit in accordance with the detected potential of the substrate or the well. Consequently, the latch-up of parasitic transistors in a CMIS-inverter circuit of the semiconductor device can be prevented.

I claim:

1. A semiconductor device comprising:
   a first region of a first conductivity type incorporating second regions of a second conductivity type opposite to said first conductivity type to form first P-N junctions therebetween;
   a third region of said second conductivity type formed in said first region, said third region incorporating fourth regions of said first conductivity type to form second P-N junctions therebetween;
   a first potential power source line for applying a first potential to said semiconductor device;
   a second potential power source line for applying a second potential to said semiconductor device, said second potential being less than said first potential;
   an internal circuit having a complementary semiconductor configuration and including means for applying a boosted potential when a potential of said first region is lower than the second potential, and having a high potential as high as said first potential;
   a bias potential generating circuit, connected to one of said first and third regions, for generating a bias potential, so that a reverse bias is generated in one of said first and second P-N junctions;
   a potential detecting circuit, connected to said first and third regions, for detecting a potential of one of said first and third regions; and
   a gate circuit, connected to receive an enabling signal and connected between said means for applying a boosted potential and said potential detecting circuit, for determining whether the means for applying a boosted potential is operating and for applying an enable signal to said internal circuit in accordance with the detected potential of one of said first and third regions.

2. A device as set forth in claim 1, wherein said first region has a P-conductivity type and said third region has an N-conductivity type.

3. A device as set forth in claim 1, wherein said potential detecting circuit comprises:
a first CMIS-inverter circuit, connected to said first region and connected to receive a reference potential and a bias potential and providing an output; and
a second CMIS-inverter circuit having an input connected to the output of said first CMIS-inverter circuit and an output connected to said gate circuit.

4. A device as set forth in claim 1, wherein said gate circuit comprises a two-input CMIS NAND gate circuit.

5. A device as set forth in claim 4, wherein said CMIS NAND gate circuit is connected to said potential detecting circuit and receives the enable signal and the output signal of said potential detecting circuit.

6. A device as set forth in claim 1, wherein said gate circuit comprises a two-input CMIS NOR gate circuit.

7. A device as set forth in claim 6, wherein said CMIS NOR gate circuit is connected to said potential detecting circuit and receives the enable signal and the output signal of said potential detecting circuit.

8. A device as set forth in claim 1, wherein said internal circuit further comprises a memory circuit connected to said booster circuit, and wherein the enable signal is an activation clock signal for activating said memory circuit.

9. A device as set forth in claim 8, wherein said memory circuit comprises:
a plurality of word lines;
a plurality of bit lines intersecting said word lines;
a plurality of memory cells connected at the intersection of said word lines and said bit lines;
a decoding circuit for receiving and decoding an address signal and for generating a selecting signal in accordance with the address signal; and
a driving circuit, connected to said decoding circuit and said word lines, for driving one word line among said plurality of word lines in accordance with said high and low potential voltage sources and in response to said selecting signal.

10. A device as set forth in claim 9, wherein each of said plurality of memory cells having a dynamic type random access memory configuration comprises:
a P-channel type MIS access gate having a source connected to one of said bit lines, having a gate connected to one of said word lines, and having a drain;
a capacitor having a first electrode connected to the drain of said P-channel type MIS access gate and having a second electrode connected to said means for applying a boosted potential.

11. A device as set forth in claim 9, wherein each of said plurality of memory cells having a static type random access memory configuration, comprises:
two loads connected to said low potential power source;
two cross-connected P-channel type MIS transistors connected between said two loads and said high potential power source; and
two MIS transfer gates connected between said two cross-connected P-channel type MIS transistors and two of said bit lines, said two MIS transfer gates being activated by the potential of one of said word lines.

12. A device as set forth in claim 1, wherein said first region has an N-conductivity type substrate and said third region has a P-conductivity type well.

13. A semiconductor device comprising:
a first region of a first conductivity type incorporating second regions of a second conductivity type opposite to said first conductivity type to form first P-N junctions therebetween;
a third region of said second conductivity type formed in said first region, said third region incorporating fourth regions of said first conductivity type to form second P-N junctions therebetween;
a first potential power source line for applying a first potential to said semiconductor device;
a second potential power source line for applying a second potential to said semiconductor device, said second potential being greater than said first potential;
an internal circuit having a complementary semiconductor configuration and including means for applying a boosted potential when a potential of said first region is higher than said first potential, and having a low potential as low as said second potential;
a bias potential generating circuit, connected to one of said first and third regions, for generating a bias potential, so that a reverse bias is generated in one of said first and second P-N junctions;
a potential detecting circuit, connected to said first and third regions, for detecting a potential of one of said first and third regions; and
a gate circuit, connected to receive an enabling signal and connected between said means for applying a boosted potential and said potential detecting circuit, for determining whether the means for applying a boosted potential is operating and for applying an enable signal to said internal circuit in accordance with the detected potential of one of said first and third regions.

14. A device as set forth in claim 13, wherein said first region has a P-conductivity type and said third region has an Nconductivity type.

15. A device as set forth in claim 13, wherein said potential detecting circuit comprises:
a first CMIS-inverter circuit, connected to said first region and connected to receive a reference potential and a bias potential and providing an output; and
a second CMIS-inverter circuit having an input connected to the output of said CMIS-inverter circuit and an output connected to said gate circuit.

16. A device as set forth in claim 13, wherein said gate circuit comprises a two-input CMIS NAND gate circuit.

17. A device as set forth in claim 16, wherein said CMIS NAND gate circuit is connected to said potential detecting circuit and receives the enable signal and the output signal of said potential detecting circuit.

18. A device as set forth in claim 13, wherein said gate circuit comprises a two-input CMIS NOR gate circuit.

19. A device as set forth in claim 18, wherein said CMIS NOR gate circuit is connected to said potential detecting circuit and receives the enable signal and the output signal of said potential detecting circuit.

20. A device as set forth in claim 13, wherein said internal circuit further comprises a memory circuit connected to said booster circuit, and wherein the enable signal is an activation clock signal for activating said memory circuit.

21. A device as set forth in claim 20, wherein said memory circuit comprises:
- a plurality of word lines;
- a plurality of bit lines intersecting said word lines;
- a plurality of memory cells connected at the intersection of said word lines and said bit lines;
- a decoding circuit for receiving and decoding an address signal and for generating a selecting signal in accordance with the address signal; and
- a driving circuit, connected to said decoding circuit and said word lines, for driving one word line among said plurality of word lines in accordance with said high and low potential voltage sources and in response to said selecting signal.

22. A device as set foth in claim 21, wherein each of said plurality of memory cells having a dynamic type random access memory configuration, comprises:
- a P-channel type MIS access gate having a source connected to one of said bit lines, having a gate connected to one of said word lines, and having a drain;
- a capacitor having a first electrode connected to the drain of said P-channel type MIS access gate and having a second electrode connected to said means for applying a boosted potential.

23. A device as set forth in claim 21, wherein each of said plurality of memory cells having a static type random access memory configuration, comprises:
- two loads connected to said low potential power source;
- two cross-connected P-channel type MIS transistors connected between said two loads and said high potential power source; and
- two MIS transfer gates connected between said two cross-connected P-channel type MIS transistors and two of said bit liens, said two MIS transfer gates being activated by the potential of one of said word lines.

24. A device as set forth in claim 13, wherein said first region has an N-conductivity type substrate and said third region has a P-conductivity type well.

* * * * *